(12) United States Patent
Miyagi

(10) Patent No.: US 7,142,834 B2
(45) Date of Patent: Nov. 28, 2006

(54) NOISE REMOVING CIRCUIT

(75) Inventor: Hiroshi Miyagi, Niigata-ken (JP)

(73) Assignee: Kabushiki Kaisha Toyota Jidoshokki and Niigata Seimitsu Co., Ltd. (JP)

( * ) Notice: Subject to any disclaimer, the term of this patent is extended or adjusted under 35 U.S.C. 154(b) by 127 days.

(21) Appl. No.: 10/500,065

(22) PCT Filed: Dec. 10, 2002

(86) PCT No.: PCT/JP02/12898

§ 371 (c)(1),
(2), (4) Date: Jun. 24, 2004

(87) PCT Pub. No.: WO03/056711

PCT Pub. Date: Jul. 10, 2003

(65) Prior Publication Data

US 2005/0127989 A1 Jun. 16, 2005

(30) Foreign Application Priority Data

Dec. 26, 2001 (JP) ............................ 2001-395233

(51) Int. Cl.
H04B 1/10 (2006.01)

(52) U.S. Cl. .................. 455/296; 455/222; 455/278.1; 455/283; 455/297; 365/194

(58) Field of Classification Search ............... 455/222, 455/278.1, 296, 297, 283; 365/194
See application file for complete search history.

(56) References Cited

U.S. PATENT DOCUMENTS 4,903,241 A 2/1990 Boudewijns ................ 365/194
5,140,704 A * 8/1992 Ueno .......................... 455/296
6,061,279 A * 5/2000 Toda et al. .................. 365/194

FOREIGN PATENT DOCUMENTS

| JP | 62-123819 | 6/1987 |
|---|---|---|
| JP | 1-136404 | 5/1989 |
| JP | 2-48830 | 2/1990 |
| JP | 5-266239 | 10/1993 |
| JP | 9-186617 | 7/1997 |
| JP | 9-284096 | 10/1997 |
| JP | 11-260093 | 9/1999 |
| JP | 2000-49570 | 2/2000 |

* cited by examiner

Primary Examiner—Nay Maung
Assistant Examiner—Tuan H. Nguyen
(74) Attorney, Agent, or Firm—Woodcock Washburn LLP

(57) ABSTRACT

An object is to provide a noise removing circuit that can be integrally formed on a semiconductor substrate and can improve the accuracy of noise component removal. The noise removing circuit comprises a highpass filter detecting a noise component included in an input signal, a pulse generating circuit generating a pulse signal corresponding to the detected noise component, an analog delaying circuit 252 delaying the input signal, and an outputting circuit removing the noise component included in the delayed signal according to the output timing of the pulse signal. The analog delaying circuit 252 delays the output timing of the input signal by making switches 51 to 56 electrically continuous in a sequential order, by holding the voltage of the input signal at each time point in a plurality of capacitors 81 to 86, and by extracting the held voltage before being updated by making switches 61 to 66 electrically continuous.

13 Claims, 7 Drawing Sheets

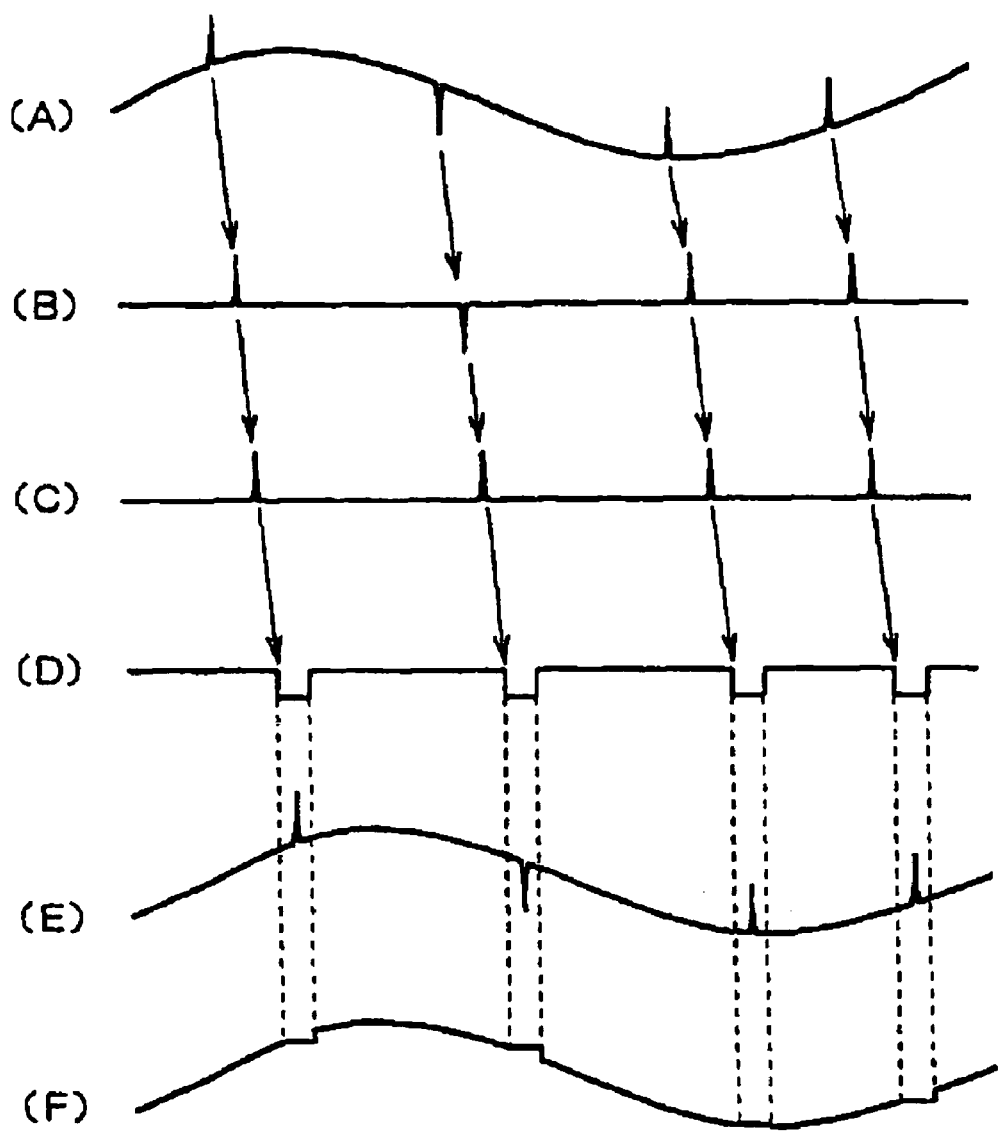
F I G. 3

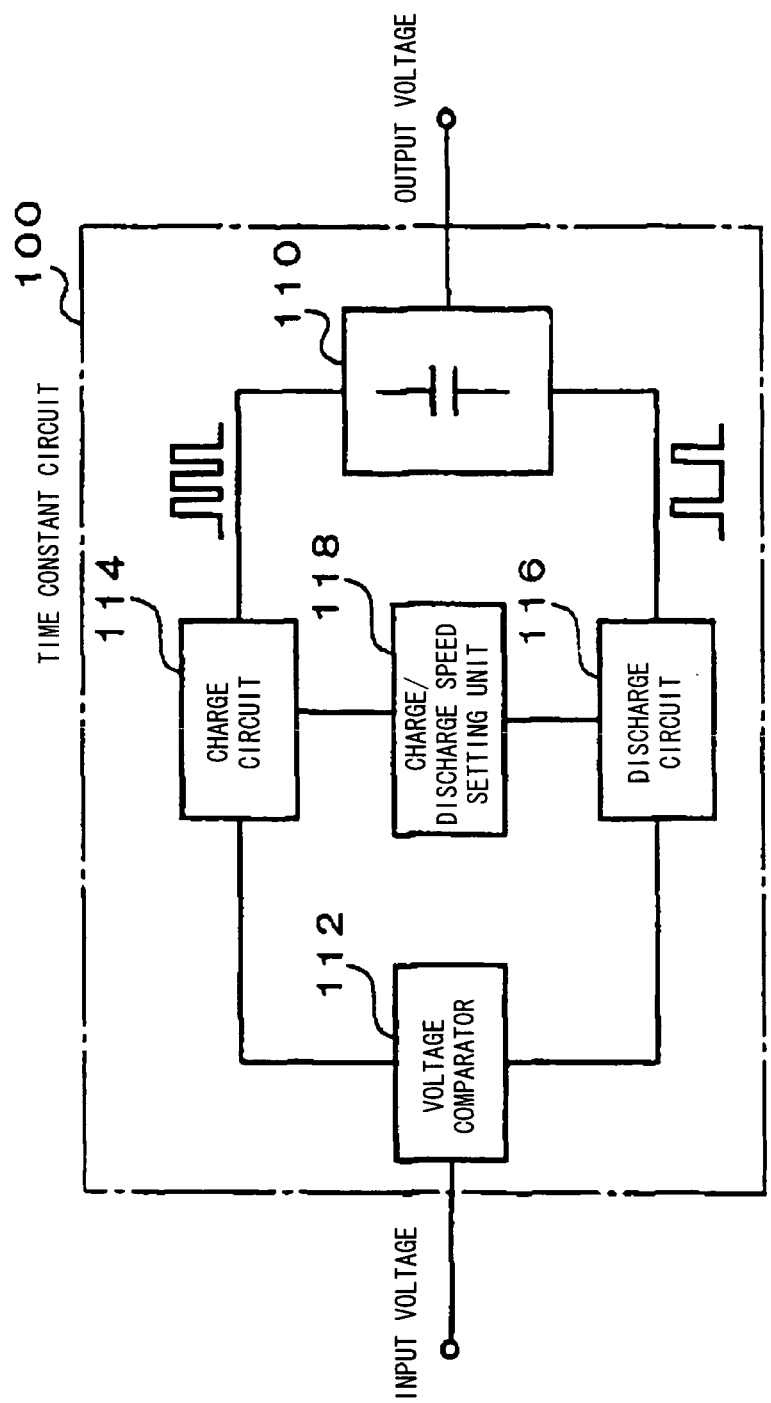
F I G. 4

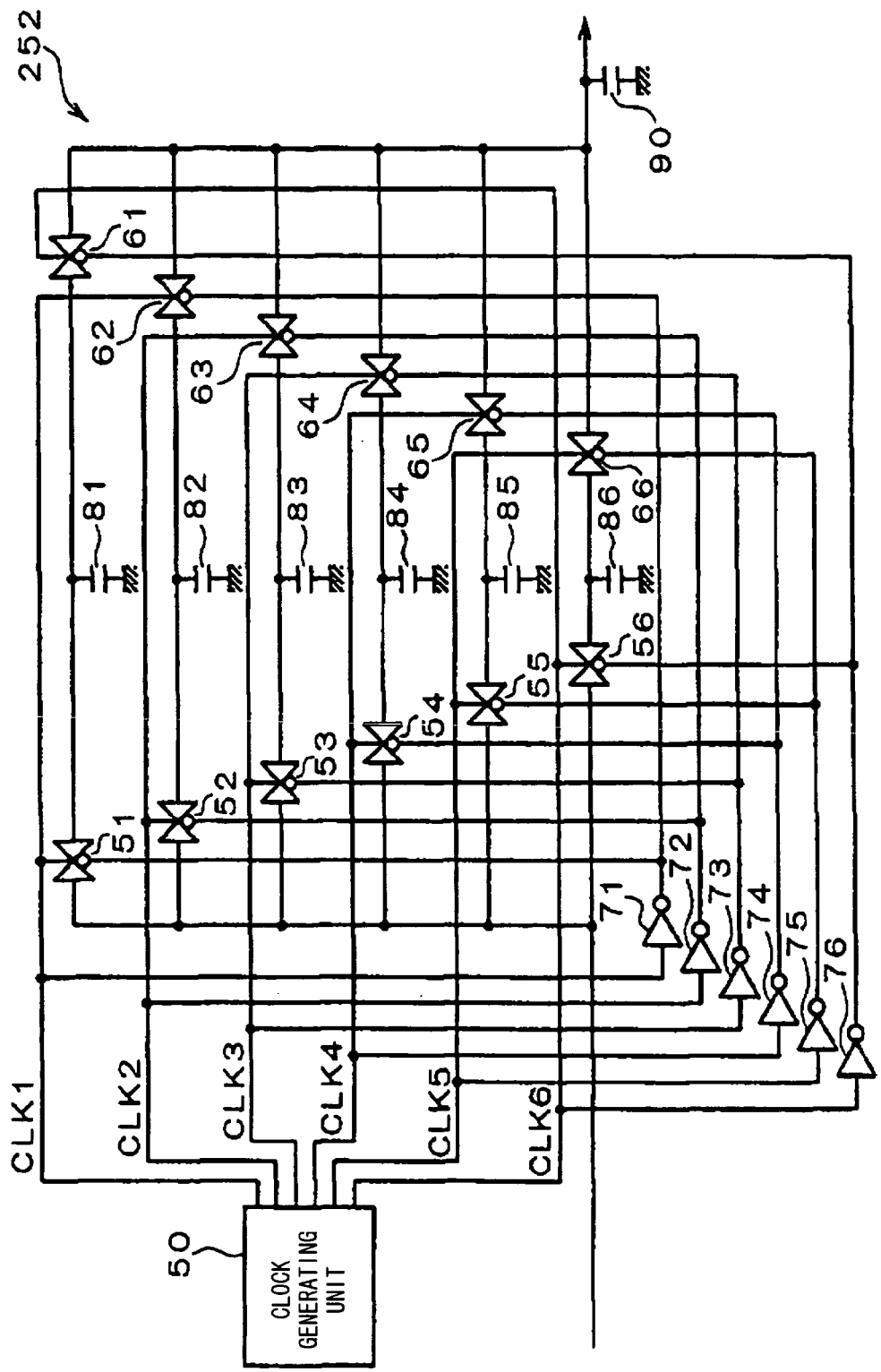
F I G. 6

NOISE REMOVING CIRCUIT

TECHNICAL FIELD

The present invention relates to a noise removing circuit removing a noise component included in a signal in a receiver, etc.

BACKGROUND ART

Noise caused by another car-mounted appliance is apt to be mixed into a signal input/output to/from an AM or FM receiver mounted in a car. Accordingly, various types of noise removing circuits are conventionally adopted. As one of examples, there is a method removing noise by extracting a noise component from a signal, by masking part of the signal, which corresponds to the noise component, and by holding the voltage of the immediately preceding input signal. With this method, a pulse signal is generated to mask the noise. However, if attempts are made to mask the noise, timing when the noise occurs and timing when the pulse signal generated based on this noise occurs must be made to match. Since a predetermined amount of time is naturally required to generate the pulse signal, an analog delaying circuit delaying the signal from which the noise is to be removed by the predetermined amount of time becomes necessary. Conventionally, a plurality of stages (such as 4 stages) of Bessel type filters are used as this analog delaying circuit.

In the meantime, since the above described Bessel type filters are configured by combining a resistor, a capacitor, and an operational amplifier, the whole of the analog delaying circuit, namely, the whole of the noise removing circuit cannot be formed on a semiconductor substrate if the device constants of the resistor and the capacitor are considered. Especially, even if a resistor and a capacitor, which have a large device constant, are formed on a semiconductor substrate, variations in the device constants of the resistor, etc. formed on the semiconductor substrate are large. Therefore, the delay time of the analog delaying circuit significantly varies. If attempts are made to precisely remove only noise, the delay time of the analog delaying circuit must be set with high accuracy. It is difficult for the analog delaying circuit using the Bessel type filters, which is formed on the semiconductor substrate, to satisfy this accuracy requirement.

DISCLOSURE OF INVENTION

The present invention is devised in view of such a point, and an object thereof is to provide a noise removing circuit that can be integrally formed on a semiconductor substrate, and can improve the accuracy of noise component removal.

To overcome the above described problem, the noise removing circuit according to the present invention comprises: a highpass filter detecting a noise component included in an input signal; a pulse generating circuit generating a pulse having a predetermined width at timing when the voltage level of the noise component output from the highpass filter becomes equal to or higher than a predetermined reference voltage; an analog delaying circuit delaying the input signal by a predetermined amount of time, and outputting the delayed signal; and an outputting circuit holding the signal output from the analog delaying circuit at immediately preceding timing when the pulse generated by the pulse generating circuit is input, and outputting the signal output from the analog delaying circuit unchanged in other cases. Additionally, the analog delaying circuit comprises: a plurality of capacitors; a plurality of first switches making the plurality of capacitors respectively hold the voltage of the input signal, which corresponds to supply timing, by supplying the input signal to the plurality of capacitors in a predetermined order at the different timing; and a plurality of second switches extracting the voltage of the input signal respectively held by the plurality of capacitors before the next timing when the voltage is held is reached. As descried above, the plurality of first switches within the analog delaying circuit are made electrically continuous in a sequential order, the voltage of the input signal at each time point is held in each of the plurality of capacitors, and the plurality of second switches are made electrically continuous and the held voltage is extracted before being updated, whereby the output timing of the signal can be delayed by the amount of time required from when the first switches are made electrically continuous until when the second switches are made electrically continuous. Especially, the analog delaying circuit is configured by using the first and the second switches the disconnection states of which can be switched, and the capacitors each holding the voltage of the signal. This eliminates the need for using a resistor and a capacitor, which have a large device constant. As a result, the whole of the noise removing circuit including the analog delaying circuit can be easily formed on a semiconductor substrate. Additionally, the amount of time required from when the first switches are made electrically continuous until when the second switches are made electrically continuous becomes the delay time of the signal. Therefore, the delay time can be set regardless of variations in device constants, so that the timing when the pulse is generated by the pulse generating circuit, and the delay time implemented by the analog delaying circuit can be made to precisely match. As a result, the accuracy of noise component removal can be improved.

Another noise removing circuit according to the present invention comprises: a noise extracting circuit extracting a noise component included in an input signal; a pulse generating circuit generating a pulse having a predetermined width at timing when the voltage level of the noise component output from the noise extracting circuit becomes a predetermined reference voltage or higher; an analog delaying circuit having a plurality of capacitors, a plurality of first switches making the plurality of capacitors respectively hold the voltage of the input signal in correspondence with supply timing by respectively supplying the input signal to the plurality of capacitors in a predetermined order at different timing, and a plurality of second switches making the plurality of capacitors output the voltage of the input signal respectively held by the plurality of capacitors in a predetermined order at timing delayed by a predetermined amount of time required until when the pulse having the predetermined width is output from the pulse generating circuit; and an outputting circuit holding the signal output from the analog delaying circuit at immediately preceding timing when the pulse having the predetermined width is output from the pulse generating circuit, and outputting the signal output from the analog delaying circuit unchanged in other cases.

According to the present invention, the amount of time required from when the first switches are made electrically continuous until when the second switches are made electrically continuous becomes the delay time of an input signal, whereby the delay time can be set regardless of variations in device constants. As a result, the amount of time required from when noise is detected until when the pulse generating circuit generates a pulse having a predetermined width, and the delay time implemented by the analog delaying circuit can be made to precisely match with ease, whereby the accuracy of noise component removal can be improved. Additionally, the analog delaying circuit is configured by the pluralities of first and second switches, and the plurality of capacitors, whereby the analog delaying circuit can be implemented without using a resistor and a capacitor, which have a large device constant. As a result, for example, the whole of the noise removing circuit including the analog delaying circuit can be easily formed on a semiconductor substrate.

Additionally, it is desirable to connect the output terminals of the above described plurality of second switches in common. As a result, the voltage of the signal, which is respectively distributed to and held by the plurality of capacitors, can be output as a sequential signal from the analog delaying circuit.

Furthermore, it is desirable to exclusively make the above described plurality of first switches electrically continuous. Or, it is desirable to exclusively make the above described plurality of second switches electrically continuous. As a result, charge and discharge operations of each of the plurality of capacitors within the analog delaying circuit can be separately performed, so that the charge and discharge operations of each of the capacitors can be stabilized.

Still further, it is desirable that each of the above described pluralities of first and second switches is an analog switch configured by connecting an FET of a p-channel type and an FET of an n-channel type in parallel. As a result, a resistance value when the first and the second switches are made electrically continuous can be made almost constant regardless of the voltage of an input signal, so that the distortion of the output signal of the analog delaying circuit due to a change in the voltage of the input signal can be prevented from occurring.

Still further, it is desirable that the above described analog delaying circuit further comprises clock generating means for generating a clock signal that cyclically selects the pluralities of first and second switches. Each disconnection timing of the pluralities of first and second switches can be controlled by generating the clock signal, whereby the need for a complex control mechanism is eliminated, and the circuit configuration can be simplified.

Still further, it is desirable that the above described analog delaying circuit further comprises an output capacitor connected to the plurality of capacitors via the plurality of second switches. As a result, even if the output signal is intermittently extracted from the plurality of capacitors, a sudden variation in the voltage of the output signal can be suppressed.

Still further, it is desirable to set the capacitance of the above described output capacitor to a value smaller than the respective capacitances of the plurality of capacitors. As a result, the output signal, which varies with the voltage held by the plurality of capacitors, can be extracted with ease.

Still further, it is desirable that the respective constituent elements can be integrally formed on a semiconductor substrate. By using the above described analog delaying circuit, the whole of the noise removing circuit can be formed integrally. This can reduce the whole of the circuit in size and cost.

Besides, the clock generating means supplies the clock signal, whose one cycle is the amount of time required until when the pulse having the predetermined width is output from the pulse generating circuit, to the first and the second switches in a sequential order.

BRIEF DESCRIPTION OF DRAWINGS

FIG. 3 is a timing diagram showing the operation state of the noise removing circuit according to the preferred embodiment;

FIG. 4 is a circuit block diagram showing a time constant circuit;

FIG. 6 shows the details of the configuration of an analog delaying circuit.

BEST MODE FOR CARRYING OUT THE INVENTION

Hereinafter, a noise removing circuit according to one preferred embodiment, to which the present invention is applied, is described with reference to the drawings.

Figure 1:
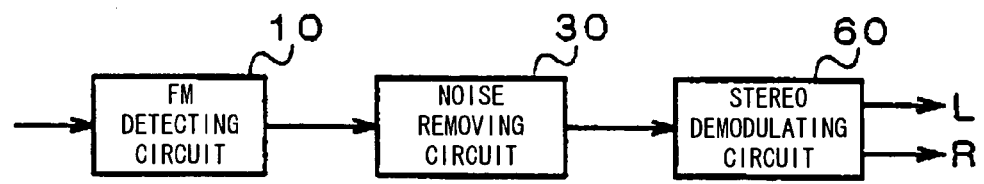
FIG. 1 shows a partial configuration of an FM receiver including a noise removing circuit according to one preferred embodiment.

FIG. 1 shows a partial configuration of an FM receiver including a noise removing circuit according to one preferred embodiment. As shown in FIG. 1, the FM receiver in this preferred embodiment is configured by comprising an FM detecting circuit 10, a noise removing circuit 30, and a stereo demodulating circuit 60. The FM detecting circuit 10 outputs a stereo composite signal by executing an FM detection process for an intermediate frequency signal amplified by an intermediate frequency amplifying circuit (not shown). The noise removing circuit 30 removes noise included in the FM stereo composite signal input from the FM detecting circuit 10. The stereo demodulating circuit 60 executes a stereo demodulation process for separating L and R signals included in the input stereo composite signal.

Figure 2:
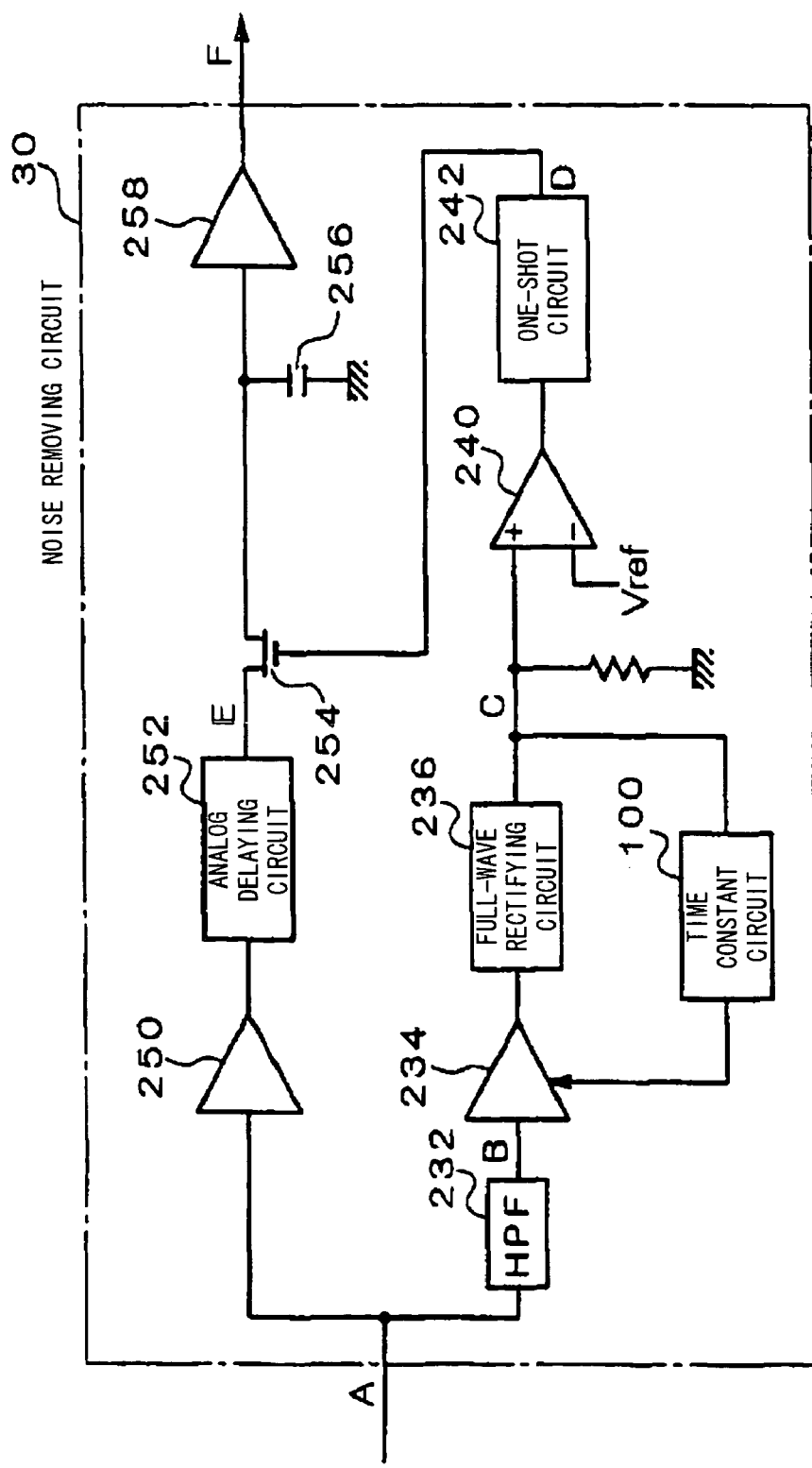
FIG. 2 shows the configuration of the noise removing circuit shown in FIG. 1.

FIG. 2 shows the configuration of the noise removing circuit 30 shown in FIG. 1. As shown in FIG. 2, the noise removing circuit 30 is configured by comprising a highpass filter (HPF) 232, an amplifier 234, a full-wave rectifying circuit 236, a time constant circuit 100, a voltage comparator 240, a 1-shot circuit 242, an amplifier 250, an analog delaying circuit 252, an FET 254, a capacitor 256, and a buffer 258. In this preferred embodiment, the noise removing circuit 30 and the whole of its peripheral circuits are integrally formed on a semiconductor substrate with a CMOS process, etc. depending on need.

The highpass filter (corresponding to a noise extracting circuit) 232 makes only a high-frequency component, which includes a noise component included in the stereo composite signal output from the FM detecting circuit 10, pass through. The amplifier 234 amplifies the noise component that passes through the highpass filter 232 with a gain corresponding to an applied control voltage. The full-wave rectifying circuit 236 makes full-wave rectification for the amplified noise component output from the amplifier 234. Generally, noises mixed into a signal having a predetermined voltage level are noise having a negative polarity in addition to that having a positive polarity. Therefore, the full-wave rectifying circuit 236 rectifies the two types of noise components having different polarities, and generates a noise component having the same polarity. The time constant circuit 100 generates a control voltage applied to the amplifier 234 by smoothing the noise component rectified by the full-wave rectifying circuit 236 with a predetermined time constant. Details of the configuration and the operations of the time constant circuit 100 will be described later.

The voltage comparator 240 makes a comparison between the noise component rectified by the full-wave rectifying circuit 236 and a predetermined reference voltage Vref, and makes the level of the output high in correspondence with noise whose peak value exceeds the reference voltage Vref. The 1-shot circuit 242 generates a one-shot pulse having a predetermined pulse width when the level of the output of the voltage comparator 240 becomes high, namely, when noise is detected.

The amplifier 250 amplifies the stereo composite signal that is detected and output from the FM detecting circuit 10. The analog delaying circuit 252 delays the input stereo composite signal by a predetermined amount of time, and outputs the delayed signal. This delay time is set in correspondence with the processing time of the respective circuits from the above described highpass filter 232 to the one-shot circuit 242. The FET 254 is a switching element that makes the stereo composite signal output from the analog delaying circuit 252 pass through, or interrupts the signal. The FET 254 interrupts the stereo composite signal when the pulse output from the one-shot circuit 242 is input to a gate, or makes the signal pass through in other cases. The capacitor 256 holds the immediately preceding level of the signal when the stereo composite signal is interrupted by the FET 254. The buffer 258 has high-input impedance. The stereo composite signal that passes through the FET 254, or the voltage held by the capacitor 256, which is immediately preceding the interrupt, is externally extracted via this buffer 258.

The above described voltage comparator 240 and one-shot circuit 242, and the FET 254, the capacitor 256, and the buffer 258 respectively correspond to the pulse generating circuit, and the outputting circuit.

FIG. 3 is a timing diagram showing the operation state of the noise removing circuit 30 according to this preferred embodiment. In FIG. 3, (A) to (F) respectively show the input/output signal waveforms of the units denoted with the same reference numerals as those in FIG. 2.

When the stereo composite signal in which noise is mixed is output from the FM detecting circuit 10 (FIG. 3(A)), the noise component included in the stereo composite signal is extracted by the highpass filter 232 (FIG. 3(B)). The full-wave rectifying circuit 236 rectifies the noise component (FIG. 3(C)), and the one-shot circuit 242 generates a pulse signal corresponding to each noise (FIG. 3(D)).

Additionally, the analog delaying circuit 252 delays the stereo composite signal output from the FM detecting circuit 10 by the amount of time required to generate the pulse signal, and outputs the delayed signal (FIG. 3(E)). As a result, the timing when the noise included in the stereo composite signal is output, and the timing when the pulse corresponding to the noise is output from the one-shot circuit 242 are made to match. The FET 254 interrupts the input stereo composite signal when the pulse is output from the one-shot circuit 242. When the signal is interrupted, the voltage held by the capacitor 256 immediately preceding the interrupt is extracted by the buffer 258. Therefore, the portion corresponding to the noise component is replaced with the immediately preceding voltage in the stereo composite signal output from the buffer 258.

In the meantime, the time constant of the time constant circuit 100 is set to a value to a degree not responding to random noise as shown in FIG. 3(C). However, especially, in the case of FM broadcasting, white noise tends to increase as a whole if the intensity of the reception electric field of the broadcasting wave decreases. In such a case, the control voltage generated by the time constant circuit 100 rises, and the gain of the amplifier 234 drops. Accordingly, the output voltage of the full-wave rectifying circuit 236 becomes low, and the output voltage of the voltage comparator 240 holds a low level, so that the one-shot circuit 242 does not generate the pulse. Accordingly, the stereo composite signal output from the analog delaying circuit 252 is output via the buffer 258 without being interrupted by the FET 254. If the white noise included in the stereo composite signal increases, the interrupt of the signal by the FET 254 must be immediately stopped. Therefore, the amount of time (attack time) during which the control voltage generated by the time constant circuit 100 rises and the gain of the amplifier 234 drops must be set to a small value. In the meantime, it is desirable to set the amount of time (release time) during which the gain of the amplifier 234 rises to some large value in consideration of the stability of the operations, etc.

FIG. 4 is a circuit block diagram showing the time constant circuit 100. As shown in FIG. 4, the time constant circuit 100 in this preferred embodiment comprises a capacitor 110, a voltage comparator 112, a charge circuit 114, a discharge circuit 116, and a charge/discharge speed setting unit 118. The voltage comparator 112 makes a comparison between the terminal voltage of the capacitor 110 and the input voltage, and validates the operations of the charge circuit 114 or the discharge circuit 116 according to a comparison result. The charge circuit 114 charges the capacitor 110 by intermittently supplying a charge current. For example, this charge circuit 114 is configured by comprising a constant-current circuit and a switch. When the switch switches to an ON state, the charge current is supplied from the constant-current circuit to the capacitor 110. Additionally, the discharge circuit 116 discharges the capacitor 110 by intermittently supplying a discharge current. For example, the discharge circuit 116 is configured by comprising a constant-current circuit and a switch. When the switch switches to an ON state, the constant current is emitted from the capacitor 110. The charge/discharge speed setting unit 118 makes settings such that the speed at which the capacitor 110 is charged by the charge circuit 114, and the speed at which the capacitor 110 is discharged by the discharge circuit 116 are made different.

As described above, the time constant circuit 100 in this preferred embodiment performs the intermittent charge/discharge operations for the capacitor 110. Accordingly, even if the capacitance of the capacitor 110 is set to a small value, the voltage of the capacitor varies moderately, and a charge/discharge characteristic equivalent to that in the case where a circuit having a large time constant, namely, a capacitor having a large capacitance, or a resistor having a large resistance value is used can be obtained. Additionally, the charge circuit 114 or the discharge circuit 116 performs control for supplying or emitting the predetermined current to/from the capacitor 110. Since these supply/emission operations are intermittently performed, the current value at that time can be set to some large value, which is suitable for being put into an IC. Accordingly, it becomes easy to form the noise removing circuit 30 including the time constant circuit 100 on a semiconductor substrate, and to put the circuits into an IC. Additionally, since externally attached components such as a capacitor, etc. become unnecessary, the whole of the noise removing circuit 30 can be significantly reduced in size.

Furthermore, in the time constant circuit 100 in this preferred embodiment, settings such that the charge and the discharge speeds for the capacitor 110 are made different are made by the charge/discharge speed setting unit 118. Accordingly, the amount of time during which the gain of the amplifier 234 drops with a rise in the control voltage, and the amount of time during which the gain of the amplifier 234 rises with a drop in the control voltage can be made different.

Figure 5:
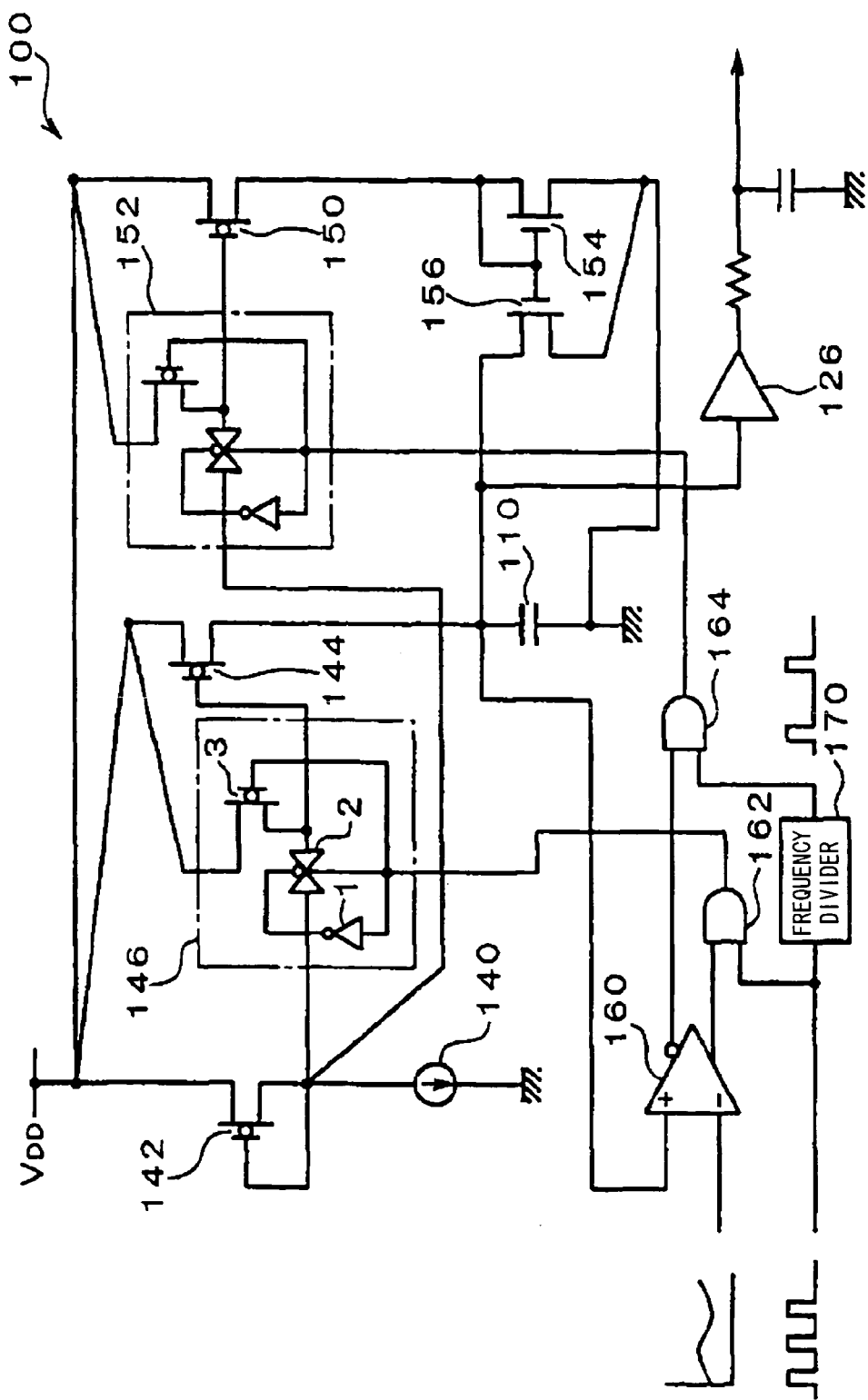
FIG. 5 is a circuit diagram showing a specific configuration of the time constant circuit.

FIG. 5 is a circuit diagram showing a specific configuration of the time constant circuit 100. As shown in FIG. 5, the time constant circuit 100 is configured by comprising a capacitor 110, a constant-current circuit 140, FETs 142, 144, 150, 154, and 156, switches 146 and 152, a voltage comparator 160, AND circuits 162 and 164, and a frequency divider 170.

A current mirror circuit is configured by the two FETs 142 and 144, and the same charge current as the constant current output from the constant-current circuit 140 is generated. Additionally, the generation timing of the charge current is determined by the switch 146.

The switch 146 is configured by an inverter circuit 1, an analog switch 2, and an FET 3. The analog switch 2 is configured by connecting the sources and the drains of a p-channel FET and an n-channel FEF in parallel. The output signal of the AND circuit 162 is directly input to the gate of the n-channel FET, and at the same time, a signal obtained by inverting the logic of this output signal with the inverter circuit 1 is input to the gate of the p-channel FET. Accordingly, the analog switch 2 swithes to an ON state when the output signal of the AND circuit 162 is a high level, or switches to an OFF state when the output signal of the AND circuit 162 is a low level. Additionally, the FET 3 is intended to securely stop the current supply operation performed by the FET 144 by connecting between the gate and the drain of the FET 144 with low resistance when the analog switch 2 is in an OFF state.

When the switch 146 switches to an ON state, the gate of one FET 142, to which the constant-current circuit 140 is connected, and the gate of the other FET 144 becomes a connection state. Therefore, a current almost the same as the constant current, which is generated by the constant current circuit 140 connected to one FET 142, also flows between the source and the drain of the other FET 144. This current is supplied to the capacitor 110 as a charge current. Or, if the switch 146 switches to an OFF state, the gate of the FET 144 becomes a state of being connected to the drain. Therefore, a this charge current supply is stopped.

Furthermore, a current mirror circuit, which sets the discharge current of the capacitor 110, is configured by combining the FET 150 with the above described FET 142 and constant-current circuit 140, and its operation state is determined by the switch 152. The switch 152 has the same configuration as that of the switch 146. The ON/OFF state of this switch 152 is controlled according to the logic of the output signal of the AND circuit 164. The switch 152 switches to an ON state when the output signal is a high level, or switches to an OFF state when the output signal is a low level.

When the switch 152 switches to the ON state, the gate of one FET 142 to which the constant-current circuit 140 is connected, and the gate of the other FET 150 switches to the connection state. Therefore, almost the same current as the constant current generated by the constant current circuit 140 also flows between the source and the drain of the other FET 150. This current becomes the discharge current that emits an electric charge accumulated in the capacitor 110.

However, the current flowing into the FET 150 cannot be directly extracted from the capacitor 110. Therefore, another current mirror circuit configured by the FETs 154 and 156 is connected to the source side of the FET 150 in this preferred embodiment.

The gates of the two FETs 154 and 156 are connected, so that the same current also flows between the source and the drain of the other FET 156 when the above described discharge current flows into the FET 154. The drain of this FET 156 is connected to a terminal on the high potential side of the capacitor 110. The current flowing into the FET 156 is generated in a way such that the electric charge accumulated in the capacitor 110 is emitted.

Additionally, the voltage comparator 160 makes a comparison of whether the terminal voltage of the capacitor 110, which is applied to a plus terminal, is either higher or lower than the input voltage of the time constant circuit 100, which is applied to a minus terminal. This voltage comparator 160 comprises a non-inversion output terminal and an inversion output terminal. If the terminal voltage of the capacitor 110, which is applied to the plus terminal, is higher than the input voltage, which is applied to the minus terminal, a high-level signal is output from the non-inversion output terminal, and a low-level signal is output from the inversion output terminal. Or, if the terminal voltage of the capacitor 110, which is applied to the plus terminal, is lower than the input voltage, which is applied to the minus terminal, a low-level signal is output from the non-inversion output terminal, and a high-level signal is output from the inversion output terminal.

For the AND circuit 162, a predetermined pulse signal is input to one of its input terminals, and the non-inversion output terminal of the voltage comparator 160 is connected to the other of the input terminals. Accordingly, a predetermined pulse signal is output from the AND circuit 162 if the terminal voltage of the capacitor 110 is higher than the input voltage of the time constant circuit 100.

Additionally, for the AND circuit 164, a predetermined pulse signal output from the frequency divider 170 is input to one of its input terminals, and the inversion output terminal of the voltage comparator 160 is connected to the other of the input terminals. Accordingly, a predetermined pulse signal is output from the AND circuit 164 if the terminal voltage of the capacitor 110 is lower than the input voltage of the time constant circuit 100.

The frequency divider 170 divides the pulse signal input to one of the input terminals of the AND circuit 162 at a predetermined frequency division ratio, and outputs the divided signal. As described above, the pulse signal after being frequency-divided is input to one of the input terminals of the AND circuit 164.

The time constant circuit 100 has such a configuration, and its operations are described next.

If the capacitor 110 is not charged when the operations of the time constant circuit 100 start, or if the input voltage of the time constant circuit 100 tends to rise, the terminal voltage of the capacitor 110 is in a state of being lower than the input voltage of the time constant circuit 100. At this time, the pulse signal is output from the AND circuit 162, whereas the pulse signal is not output from the AND circuit 164. Accordingly, only the switch 146 intermittently switches to the ON state, and a predetermined charge current is supplied to the capacitor 110 at the timing when the switch 146 switches to the ON state. This charge operation is continued until when the terminal voltage of the capacitor 110 becomes relatively higher than the input voltage of the time constant circuit 100.

Or, if the terminal voltage of the capacitor 110 exceeds the input voltage of the time constant circuit 100 with this charge operation, or if the input voltage tends to drop, and the input voltage is lower than the terminal voltage of the capacitor 110, the pulse signal is output from the AND circuit 164, but the pulse signal is not output from the AND circuit 162. Accordingly, only the switch 152 intermittently switches to an ON state, and a predetermined discharge current is emitted from the capacitor 110 when the switch 152 switches to the ON state. This discharge operation is continued until when the terminal voltage of the capacitor 110 becomes relatively lower than the input voltage of the time constant circuit 100.

Making a comparison between the two types of the pulse signals output from the above described two AND circuits 162 and 164, the duty ratio of the pulse signal output from the AND circuit 162 is higher than that of the pulse signal output from the AND circuit 164. Therefore, the charge speed per unit time is faster than the discharge speed per unit time if a case where the pulse signals are output respectively from the two AND circuits 162 and 164 for the same time period is considered.

In the above described time constant circuit 100, the frequency divider 170 is used to output the pulse signals having the different duty ratios from the two AND circuits 162 and 164. However, pulse signals having different duty ratios may be separately generated, and respectively input to the two AND circuits 162 and 164. Or, the charge time and the discharge time of the capacitor 100 can be made identical by removing the frequency divider 170.

Additionally, the ratios of the ON states of the FETs 144 and 150 per unit time are made different in order to make the charge speed and the discharge speed for the capacitor 100 differ in the above described time constant circuit 100. However, the sizes of the gates of these FETs are made different, so that the charge and the discharge currents themselves may be made different.

FIG. 6 shows the details of the configuration of the analog delaying circuit 252. As shown in FIG. 6, the analog delaying circuit 252 is configured by comprising a clock generating unit 50, analog switches 51 to 56 and 61 to 66, inverter circuits 71 to 76, and capacitors 81 to 86 and 90. The above described analog switches 51 to 56, and analog switches 61 to 66 respectively correspond to the first and the second switches.

The clock generating unit 50 generates 6 clock signals CLK1 to 6 having different output timing in a predetermined order. For these 6 clock signals CLK1 to 6, their cycles are the same, and their high-level durations are set to be mutually exclusive and redundant. Additionally, the cycles of the clock signals CLK1 to 6 are set to match with the amount of time required from when noise is detected until when the pulse is output from the one-shot circuit 242. This clock generating unit 50 corresponds to the clock generating means.

The first clock signal CLK1 is input to the two analog switches 51 and 62 directly and via the inverter circuit 71. If one analog switch 51 becomes electrically continuous in correspondence with the clock signal CLK1, the voltage of the input signal at this electrical continuity timing is applied to the capacitor 81, and the applied voltage is held by the capacitor 81. Or, if the other analog switch 62 becomes electrically continuous in correspondence with the clock signal CLK1, one end of the capacitor 82 is connected to the output terminal side, and the voltage held by the capacitor 82 is externally extracted as an output voltage.

The second clock signal CLK2 is input to the two analog switches 52 and 63 directly and via the inverter circuit 72. If one analog switch 52 becomes electrically continuous in correspondence with the clock signal CLK2, the voltage of the input signal at this electrical continuity timing is applied to the capacitor 82, and this applied voltage is held by the capacitor 82. Or, if the other analog switch 63 becomes electrically continuous in correspondence with the clock signal CLK2, one end of the capacitor 83 is connected to the output terminal side, and the voltage held by the capacitor 83 is externally extracted as an output voltage.

The third clock signal CLK3 is input to the two analog switches 53 and 64 directly and via the inverter circuit 73. If one analog switch 53 becomes electrically continuous in correspondence with the clock signal CLK3, the voltage of the input signal at this electrical continuity timing is applied to the capacitor 83, and the applied voltage is held by the capacitor 83. Or, if the other analog switch 64 becomes electrically continuous in correspondence with the clock signal CLK3, one end of the capacitor 84 is connected to the output terminal side, and the voltage held by the capacitor 84 is externally extracted as an output voltage.

The fourth clock signal CLK4 is input to the two analog switches 54 and 65 directly and via the inverter circuit 74. If one analog switch 54 becomes electrically continuous in correspondence with the clock signal CLK4, the voltage of the input signal at this electrical continuity timing is applied to the capacitor 84, and the applied voltage is held by the capacitor 84. Or, if the other analog switch 65 becomes electrically continuous in correspondence with the clock signal CLK4, one end of the capacitor 85 is connected to the output terminal side, and the voltage held by the capacitor 85 is externally extracted as an output voltage.

The fifth clock signal CLK5 is input to the two analog switches 55 and 66 directly and via the inverter circuit 75. If one analog switch 55 becomes electrically continuous in correspondence with the clock signal CLK5, the voltage of the input signal at this electrical continuity timing is applied to the capacitor 85, and the applied voltage is held by the capacitor 85. Or, if the other analog switch 66 becomes electrically continuous in correspondence with the clock signal CLK5, one end of the capacitor 86 is connected to the output terminal side, and the voltage held by the capacitor 86 is externally extracted as an output voltage.

The sixth clock signal CLK6 is input to the two analog switches 56 and 61 directly and via the inverter circuit 76. If one analog switch 56 becomes electrically continuous in correspondence with the clock signal CLK6, the voltage of the input signal at this electrical continuity timing is applied to the capacitor 86, and the applied voltage is held by the capacitor 86. Or, if the other analog switch 61 becomes electrically continuous in correspondence with the clock signal CLK6, one end of the capacitor 81 is connected to the output terminal side, and the voltage held by the capacitor 81 is externally extracted as an output voltage.

The capacitor 90 is an output capacitor for smoothing. If all of the analog switches 61 to 66 are in a non-continuity state, the voltages which are held by the capacitors 81 to 86 and extracted on the output terminal side immediately preceding the non-continuity state, are maintained. The capacitance of this capacitor 90 is set to a value smaller than the respective capacitances of the other capacitors 81 to 86, such as approximately 1/10. As a result, it becomes easy to generate an output signal that varies with the voltages respectively held by the capacitors 81 to 86, and to extract the signal externally to the analog delaying circuit 252.

Additionally, each of the above described analog switches 51 to 56 and 61 to 66 is configured by connecting an FET of a p-channel type and an FET of an n-channel type in parallel. Accordingly, ON resistance becomes almost constant even if the voltage level of an input signal varies, so that the distortion of an output signal does not occur when the voltage level of the input signal varies.

Next, the operations of the analog delaying circuit 252 in this preferred embodiment are described.

Figure 7:
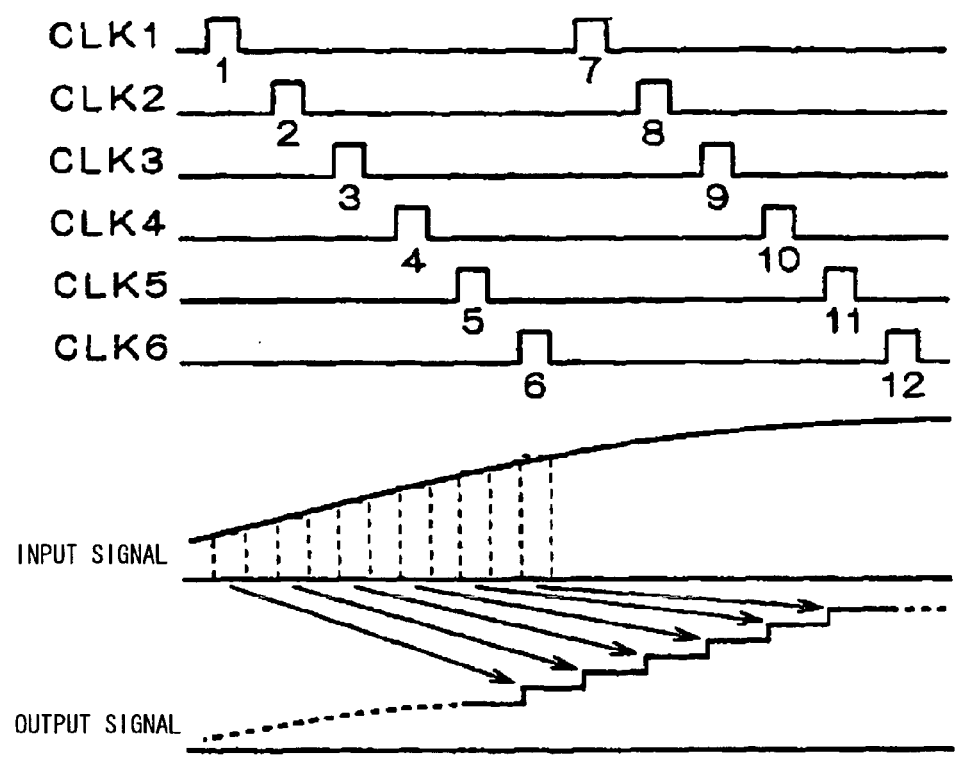
FIG. 7 shows the operation timing of the analog delaying circuit.

FIG. 7 shows the operation timing of the analog delaying circuit 252. In FIG. 7, numerals 1 to 12 respectively assigned to the clock signals CLK1 to 6 show the output order (order where the clock signals exclusively become a high level) of the clock signals. Thus, the 6 types of clock signals CLK1 to CLK6, which cyclically select the analog switches 51 to 56 and 61 to 66, are output from the clock generating unit 50. In this preferred embodiment, "redundant selection" means that the 6 analog switches are sequentially selected, and the sequential selection restarts from the first switch after completing the selection once.

When the clock signal CLK1 is initially input (number 1), the analog switch 51 becomes electrically continuous at this timing, and the capacitor 81 is charged, so that the voltage of the input signal is held. Similarly, when the clock signal CLK2 is input next (number 2), the analog switch 52 becomes electrically continuous at this timing, and the capacitor 82 is charged, so that the voltage of the input signal is held.

As described above, when the clock signals CLK1 to 6 are sequentially input, the respectively corresponding analog switches 51 to 56 become electrically continuous, and the voltage of the input signal is held in the capacitors connected in the later stage.

Furthermore, the voltages respectively held by the capacitors 81 to 86 are extracted at the timing immediately preceding the next update. Specifically, the clock signal CLK1 (number 7) is again output after the clock signal CLK6 (number 6) is output. Therefore, the analog switch 61 connected to the capacitor 81 becomes electrically continuous at the output timing of the clock signal CLK6, and the voltage held by the capacitor 81 is extracted on the output terminal side. Thereafter, in a similar manner, the other analog switches 62 to 66 become electrically continuous in a sequential order, and the voltages held by the capacitors 82 to 86 are sequentially extracted.

As described above, the voltage of the input signal at each time point is held in each of the capacitors 81 to 86 by making the switches 51 to 56 electrically continuous in a sequential order, and the held voltage is extracted before being updated by making the switches 61 to 66 electrically continuous, whereby the output timing of the signal can be delayed by the amount of time required from when the switches 51 to 56 are made electrically continuous until when the respectively corresponding switches 61 to 66 are made electrically continuous.

Especially, the analog delaying circuit 252 can be configured by using the switches 51 to 56 and 61 to 66, whose disconnection states can be switched, the capacitors 81 to 86 holding the voltage of a signal, and other additional circuits such as the clock generating circuit 50, etc. This eliminates the need for using a resistor and a capacitor, which have a large device constant. Therefore, the whole of the noise removing circuit 30 including the analog delaying circuit 252 can be easily formed on a semiconductor substrate.

Additionally, since the amount of time required from when the switches 51 to 56 are made electrically continuous until when the respectively corresponding switches 61 to 66 are made electrically continuous becomes the delay time of a signal. Therefore, the delay time can be precisely set according to the generation timing of the clock signal, and the numbers of analog switches and capacitors. As a result, the timing when the pulse is generated by the one-shot circuit 242, and the delay time implemented by the analog delaying circuit 252 can be made to precisely match, whereby the accuracy of the noise component removal 30 can be improved.

Additionally, the clock signal is generated by the clock generating unit 50, whereby each connection and disconnection timings of the analog switches 51 to 56 and 61 to 66 can be controlled. This eliminates the need for a complex control mechanism, and the circuit configurations of the analog delaying circuit 252 and the noise removing circuit 30 can be simplified.

The present invention is not limited to the above described preferred embodiment. Variously modified implementations can be made within the scope of the gist of the present invention. For example, the above described preferred embodiment refers to the noise removing circuit 30 of the FM receiver having the general configuration. However, the present invention can be applied to a noise removing circuit included in a direct conversion receiver, etc. Especially, since a signal is separated into an in-phase component (I component) and a quadrature component (Q component) in the direct conversion receiver, a noise removing circuit must be used respectively for the separated signals. Accordingly, the present invention is applied to this noise removing circuit, whereby cost reduction can be implemented by significantly simplifying the circuit configuration.

As described above, according to the present invention, the voltage of an input signal is held in each capacitor at each time point by sequentially making the first switches within the analog delaying circuit electrically continuous, and the held voltage is extracted before being updated by making the second switches electrically continuous, whereby the output timing of the signal can be delayed by the amount of time required from when the first switches are made electrically continuous until when the second switches are made electrically continuous. Especially, the analog delaying circuit is configured by using the first and the second switches, whose connection and disconnection states can be switched, and the capacitors that hold the voltage of a signal. This eliminates the need for using a resistor and a capacitor, which have a large device constant, so that the whole of the noise removing circuit including the analog delaying circuit can be easily formed on a semiconductor substrate. Furthermore, the amount of time required from when the first switches are made electrically continuous until when the second switches are made electrically continuous becomes the delay time of a signal. Therefore, the delay time can be set regardless of variations in device constants. As a result, the timing when the pulse is generated by the pulse generating circuit, and the delay time implemented by the analog delaying circuit can be made to precisely match, whereby the accuracy of noise component removal can be improved.

The invention claimed is:

1. A noise removing circuit, comprising:
   a highpass filter for detecting a noise component included in an input signal;
   an amplifier for amplifying the noise component output from the highpass filter;
   a time constant circuit for smoothing the amplified noise component with a predetermined time constant and for generating a control voltage that is applied to the amplifier, wherein said time constant circuit comprises:
   a first capacitor;
   a charge circuit for charging the first capacitor;
   a discharge circuit for discharging the first capacitor; and a charge/discharge speed setting unit that causes a difference between a charge speed of the charge circuit and a discharge speed of the discharge circuit;

a pulse generating circuit for generating a pulse having a predetermined width at timing when a voltage level of the noise component output from said highpass filter becomes a predetermined reference voltage or higher;

an analog delaying circuit for delaying the input signal by a predetermined amount of time, and for outputting the delayed signal; and an outputting circuit for holding the signal output from said analog delaying circuit at immediately preceding timing when the pulse generated by said pulse generating circuit is input, and for outputting the signal output from said analog delaying circuit unchanged in other cases, wherein said analog delaying circuit comprises:

a plurality of second capacitors;

a plurality of first switches for making said plurality of second capacitors respectively hold the voltage of the input signal in correspondence with supply timing by respectively supplying the input signal to the plurality of second capacitors in a predetermined order at different timing; and a plurality of second switches for extracting the voltage of the input signal respectively held by said plurality of second capacitors before next timing when the voltage is held is reached.

2. The noise removing circuit according to claim 1, wherein
output terminals of said plurality of second switches are connected in common.

3. The noise removing circuit according to claim 1, wherein
said plurality of first switches are exclusively made electrically continuous.

4. The noise removing circuit according to claim 1, wherein
said plurality of second switches are exclusively made electrically continuous.

5. The noise removing circuit according to claim 1, wherein
each of said pluralities of first and second switches is an analog switch configured by connecting an FET of a p-channel type, and an FET of an n-channel type in parallel.

6. The noise removing circuit according to claim 1, wherein
said analog delaying circuit further comprises clock generating means for generating a clock signal that cyclically selects each of said plurality of first switches and said plurality of second switches.

7. The noise removing circuit according to claim 6, wherein
said clock generating means supplies a clock signal, whose one cycle is an amount of time required until when the pulse having the predetermined width is output from said pulse generating circuit, to said plurality of first switches and said plurality of second switches in a sequential order.

8. The noise removing circuit according to claim 1, wherein
said analog delaying circuit further comprises third output capacitor connected to each of said plurality of second capacitors via said plurality of second switches.

9. The noise removing circuit according to claim 8, wherein
a capacitance of said third output capacitor is set to a value smaller than a capacitance of each of said plurality of second capacitors.

10. The noise removing circuit according to claim 1, wherein
constituent elements of the respective circuits are integrally formed on a semiconductor substrate.

11. The noise removing circuit according to claim 1, wherein
constituent elements of the respective circuits are integrally formed on a same semiconductor substrate with a CMOS process.

12. A noise removing circuit, comprising:
a noise extracting circuit for extracting a noise component included in an input signal;

an amplifier circuit for amplifying the noise component output from the noise extracting circuit;

a time constant circuit for smoothing the amplified noise component with a predetermined time constant and for generating a control voltage that is applied to the amplifier circuit, wherein said time constant circuit comprises:

a first capacitor;

a charge circuit for charging the first capacitor;

a discharge circuit for discharging the first capacitor; and a charge/discharge speed setting unit that causes a difference between a charge speed of the charge circuit and a discharge speed of the discharge circuit;

a pulse generating circuit for generating a pulse having a predetermined width at timing when a voltage level of the noise component output from said noise extracting circuit becomes a predetermined reference voltage or higher;

an analog delaying circuit comprising:
a plurality of second capacitors;
a plurality of first switches for making said plurality of second capacitors respectively hold the voltage of the input signal in correspondence with supply timing by respectively supplying the input signal to said plurality of second capacitors in a predetermined order at different timing; and a plurality of second switches for making said plurality of second capacitors output the voltage of the input signal respectively held by said plurality of second capacitors in a predetermined order at timing delayed by a predetermined amount of time required until when the pulse having the predetermined width is output from said pulse generating circuit; and an outputting circuit for holding the signal output from said analog delaying circuit at immediately preceding timing when the pulse having the predetermined width is output from said pulse generating circuit, and for outputting the signal output from said analog delaying circuit unchanged in other cases.

13. A noise removing circuit, comprising:
a noise extracting circuit for extracting a noise component included in an input signal;

an amplifier circuit for amplifying the noise component output from the noise extracting circuit;

a time constant circuit for smoothing the amplified noise component with a predetermined time constant and for generating a control voltage that is applied to the amplifier circuit, wherein said time constant circuit comprises:

a first capacitor;
a charge circuit for charging the first capacitor;
a discharge circuit for discharging the first capacitor;
a charge/discharge speed setting unit that causes a difference between a charge speed of the charge circuit and a discharge speed of the discharge circuit;

a pulse generating circuit for generating a pulse having a predetermined width at timing when a voltage level of the noise component output from said noise extracting circuit becomes a predetermined reference voltage or higher;

an analog delaying circuit comprising:
a plurality of second capacitors;
a plurality of first switches for making said plurality of second capacitors respectively hold the voltage of the input signal in correspondence with supply timing by respectively supplying the input signal to said plurality of second capacitors in a predetermined order at different timing; and
a plurality of second switches for making said plurality of second capacitors output the voltage of the input signal respectively held by said plurality of second capacitors in a predetermined order at timing delayed by a predetermined amount of time required until when the pulse having the predetermined width is output from said pulse generating circuit; and an outputting circuit for holding the signal output from said analog delaying circuit at immediately preceding timing when the pulse having the predetermined width is output from said pulse generating circuit, and for outputting the signal output from said analog delaying circuit unchanged in other cases.

* * * * *